US008566504B2

(12) United States Patent
Traister

(10) Patent No.: US 8,566,504 B2
(45) Date of Patent: Oct. 22, 2013

(54) DYNAMIC METABLOCKS

(75) Inventor: Shai Traister, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 1135 days.

(21) Appl. No.: 11/864,629

(22) Filed: Sep. 28, 2007

(65) Prior Publication Data

US 2009/0089482 A1    Apr. 2, 2009

(51) Int. Cl.
*G06F 12/00* (2006.01)
(52) U.S. Cl.
USPC .......................................... 711/103; 711/165
(58) Field of Classification Search
USPC ......................................... 711/103, 165, 203
See application file for complete search history.

(56) References Cited

U.S. PATENT DOCUMENTS

| | | | |
|---|---|---|---|
| 6,425,050 B1 * | 7/2002 | Beardsley et al. | 711/113 |
| 6,763,424 B2 | 7/2004 | Conley | 711/103 |
| 7,441,071 B2 | 10/2008 | Traister et al. | |
| 7,444,461 B2 | 10/2008 | Traister et al. | |
| 7,444,462 B2 | 10/2008 | Traister et al. | |
| 7,444,463 B2 | 10/2008 | Gorobets | |
| 7,451,265 B2 | 11/2008 | Traister et al. | |
| 7,464,216 B2 | 12/2008 | Gorobets | |
| 2002/0099904 A1 * | 7/2002 | Conley | 711/103 |
| 2005/0141312 A1 | 6/2005 | Sinclair et al. | |
| 2005/0144357 A1 | 6/2005 | Sinclair | 711/103 |
| 2005/0144358 A1 * | 6/2005 | Conley et al. | 711/103 |
| 2005/0144360 A1 * | 6/2005 | Bennett et al. | 711/103 |
| 2005/0144361 A1 * | 6/2005 | Gonzalez et al. | 711/103 |
| 2005/0144363 A1 * | 6/2005 | Sinclair | 711/103 |
| 2005/0144367 A1 | 6/2005 | Sinclair | 711/103 |
| 2005/0144516 A1 | 6/2005 | Gonzalez et al. | |
| 2006/0155920 A1 * | 7/2006 | Smith et al. | 711/103 |
| 2006/0161724 A1 | 7/2006 | Bennett et al. | |
| 2006/0184718 A1 * | 8/2006 | Sinclair et al. | 711/103 |
| 2007/0061502 A1 * | 3/2007 | Lasser et al. | 711/103 |
| 2007/0081386 A1 * | 4/2007 | Yoon | 365/185.11 |
| 2008/0034174 A1 | 2/2008 | Traister et al. | |
| 2008/0034175 A1 | 2/2008 | Traister et al. | |
| 2008/0082596 A1 | 4/2008 | Gorobets | |
| 2008/0082728 A1 | 4/2008 | Traister et al. | |
| 2008/0082775 A1 | 4/2008 | Gorobets | |
| 2008/0086619 A1 | 4/2008 | Traister et al. | |
| 2008/0162612 A1 | 7/2008 | Tomlin et al. | |
| 2008/0162787 A1 | 7/2008 | Tomlin et al. | |

FOREIGN PATENT DOCUMENTS

WO    WO2008/082950    7/2008

OTHER PUBLICATIONS

US Final Office Action dated Dec. 1, 2009 issued in U.S. Appl. No. 11/648,487.
US Office Action dated Jun. 8, 2009 issued in U.S. Appl. No. 11/648,487.
US Office Action dated Jun. 8, 2009 in U.S. Appl. No. 11/647,906.

(Continued)

*Primary Examiner* — Jared Rutz
(74) *Attorney, Agent, or Firm* — Weaver Austin Villeneuve & Sampson LLP

(57) ABSTRACT

A nonvolatile block erasable memory array links erase blocks together for programming with high parallelism as a metablock. Erase blocks are operated in banks, with each bank having a dedicated bus and controller. Sub-metablocks of different metablocks, in different banks, are accessed in parallel allowing different metablocks to be updated at the same time.

24 Claims, 6 Drawing Sheets

(56) References Cited

OTHER PUBLICATIONS

US Final Office Action dated Dec. 2, 2009 in U.S. Appl. No. 11/647,906.
PCT International Search Report dated Jun. 3, 2008 issued in Applicaton No. PCT/US2007/087914.
PCT Written Opinion dated Jun. 3, 2008 issued in Application No. PCT/US2007/087914.
PCT International Preliminary Report on Patentability and Written Opinion dated Jun. 30, 2009 issued in PCT/US2007/087914.

* cited by examiner

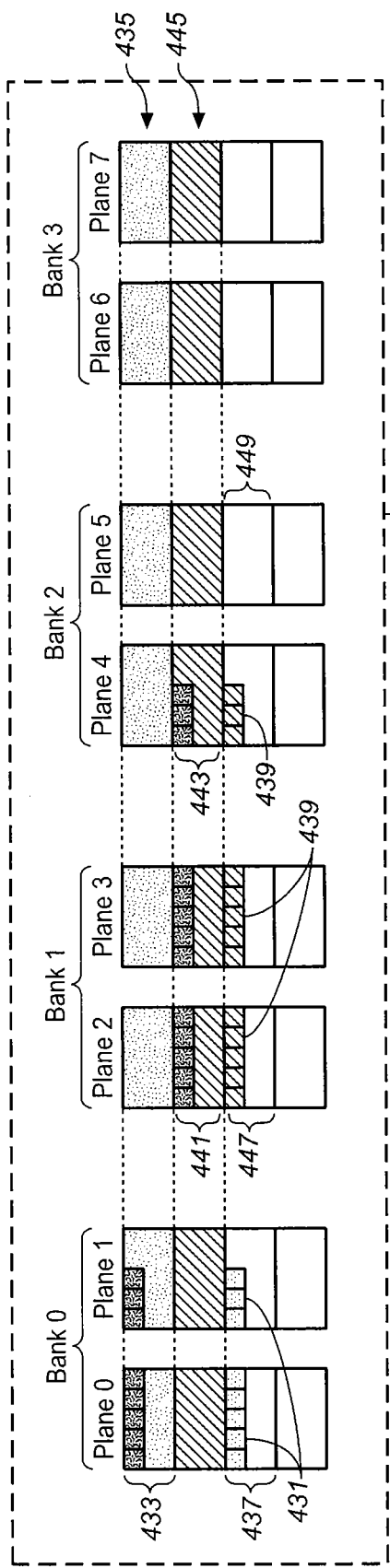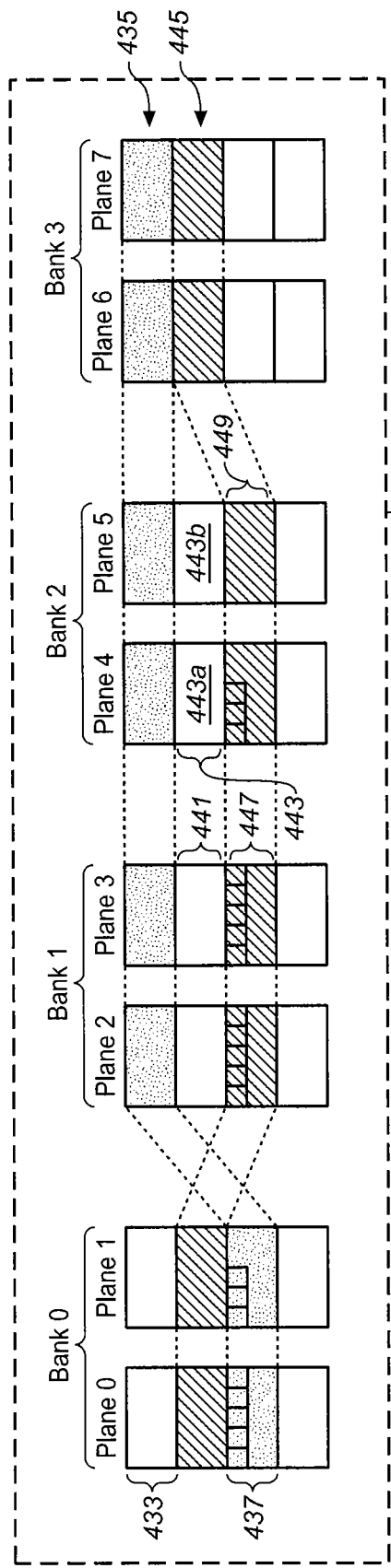

DYNAMIC METABLOCKS

BACKGROUND OF THE INVENTION

This invention relates to nonvolatile memories and methods of operating nonvolatile memories. In particular, this application relates to methods of managing data stored in block-erasable nonvolatile memory arrays.

Nonvolatile memory systems are used in various applications. Some nonvolatile memory systems are embedded in a larger system such as a personal computer. Other nonvolatile memory systems are removably connected to a host system and may be interchanged between different host systems. Examples of such removable memory systems include memory cards and USB flash drives. Electronic circuit cards, including non-volatile memory cards, have been commercially implemented according to a number of well-known standards. Memory cards are used with personal computers, cellular telephones, personal digital assistants (PDAs), digital still cameras, digital movie cameras, portable audio players and other host electronic devices for the storage of large amounts of data. Such cards usually contain a re-programmable non-volatile semiconductor memory cell array along with a controller that controls and supports operation of the memory cell array and interfaces with a host to which the card is connected. Several of the same type of card may be interchanged in a host card slot designed to accept that type of card. However, the development of the many electronic card standards has created different types of cards that are incompatible with each other in various degrees. A card made according to one standard is usually not useable with a host designed to operate with a card of another standard. Memory card standards include PC Card, CompactFlash™ card (CF™ card), SmartMedia™ card, MultiMediaCard (MMC™), Secure Digital (SD) card, a miniSD™ card, Subscriber Identity Module (SIM), Memory Stick™, Memory Stick Duo card and microSD/TransFlash™ memory module standards. There are several USB flash drive products commercially available from SanDisk Corporation under its trademark "Cruzer®." USB flash drives are typically larger and shaped differently than the memory cards described above.

Different types of memory array architecture are used in nonvolatile memory systems. In one type of architecture, a NAND array, a series of strings of more than two memory cells, such as 16 or 32, are connected along with one or more select transistors between individual bit lines and a reference potential to form columns of cells. Word lines extend across cells within a large number of these columns.

An individual memory cell may hold one bit of data in what is known as a Single Level Cell (SLC) design. In some examples, a memory cell may hold two or more bits of data in what is known as a Multi Level Cell (MLC) design.

SUMMARY OF THE INVENTION

According to an embodiment of the invention, a method of operating a block-erasable nonvolatile memory array comprises: programming first data to a first plurality of blocks in parallel, each of the first plurality of blocks from a different one of a plurality of planes; programming second data to a second plurality of blocks in parallel, each of the second plurality of blocks from a different one of the plurality of planes; subsequently copying data from a first block of the first plurality of blocks, without copying data from other ones of the first plurality of blocks, the first block located in a first plane of the plurality of planes; and in parallel with copying data from the first block, accessing a second block of the second plurality of blocks, the second block located in a second plane of the plurality of planes.

According to an embodiment a nonvolatile memory system comprises: a block erasable nonvolatile memory array having blocks arranged in separate planes, each plane having separate read/write circuits; a first metablock formed from a first plurality of blocks, one block from each of a plurality of planes, the first plurality of blocks linked for parallel programming; a second metablock formed from a second plurality of blocks, one from each of the plurality of planes, the second plurality of blocks linked for parallel programming; a first replacement block that replaces a first block of the first plurality of blocks, without replacing other blocks of the first plurality of blocks; a second replacement block that replaces a second block of the second plurality of blocks, without replacing other blocks of the second plurality of blocks; and means for replacing the first block with the replacement block in parallel with replacing the second block with the second replacement block.

BRIEF DESCRIPTION OF THE DRAWINGS

FIG. 4A shows an example where updated data for two different metablocks is stored in different banks of a memory array.

FIG. 4B shows the memory array of FIG. 4A after copying of valid data of a first metablock in bank 0, copying of data of a second metablock in banks 1 and 2, and relinking of new sub-metablocks to form updated metablocks.

DETAILED DESCRIPTION OF ILLUSTRATED EMBODIMENTS

Figure 1:
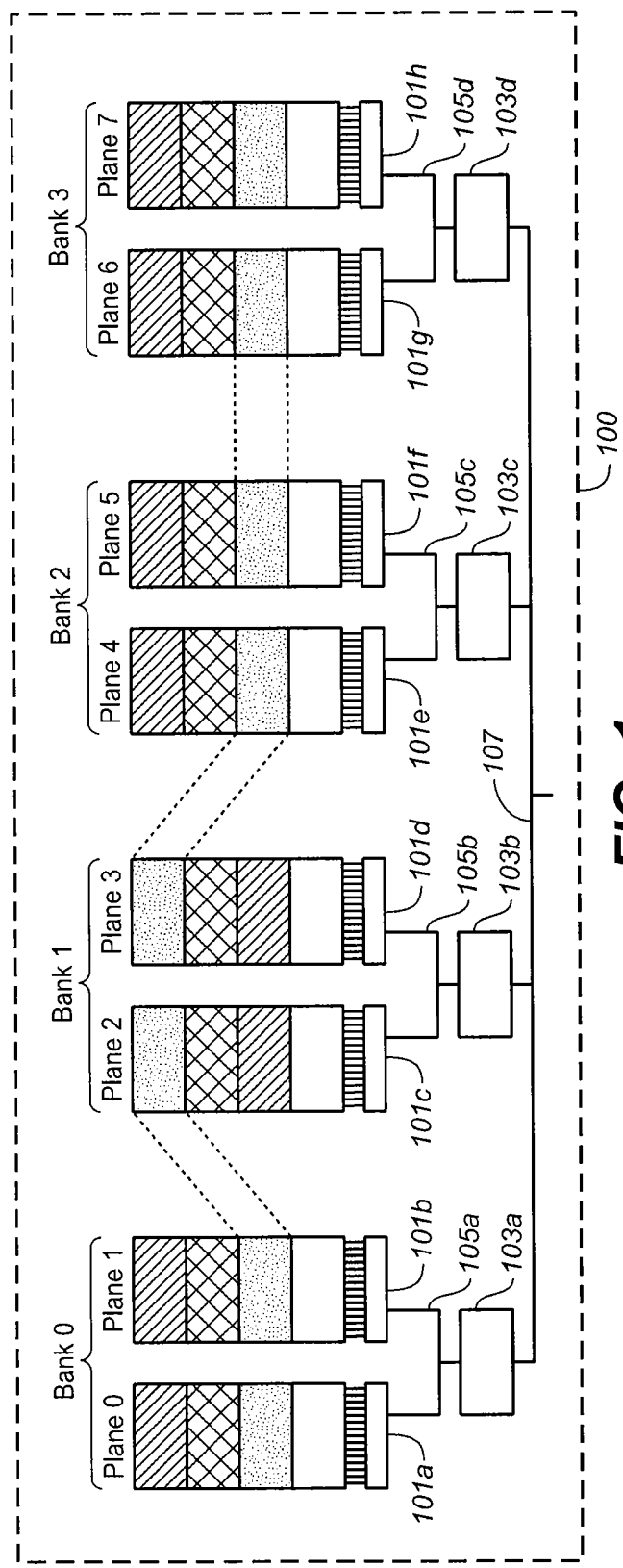
FIG. 1 shows a portion of an exemplary memory system having planes arranged in banks, with each bank having a dedicated bus and bank controller.

In a common nonvolatile memory array, memory cells are erased together in a minimum unit of erase called an erase block. In some designs, erase blocks are linked together to form metablocks, where all the erase blocks forming a metablock may be accessed in parallel. Erase blocks of a metablock are in different planes, with each plane having dedicated read/write circuits. A block generally contains one or more pages, where a page is the minimum unit of programming. Metablocks are generally programmed by programming a page from each erase block of the metablock in parallel. The pages programmed in parallel in this manner may be considered a metapage. Examples of metablocks are described in U.S. Pat. No. 6,763,424. In general, metablocks allow a high degree of parallelism when accessing a block erasable memory array. This provides improved performance when dealing with large portions of data. For example, when a large file is sent by a host, it can be programmed to multiple erase blocks in parallel. Generally, a memory array has metablocks of uniform size, using one erase block from each plane to provide the maximum parallelism available. Metablocks do not always provide good performance where small portions of data are involved. For example, where a portion of updated data that is smaller than a metablock is received from a host to replace data already stored in a metablock, the valid data in the original metablock is generally copied to a new metablock where it is written with the updated data. Such copying may impose a significant overhead, especially for very large metablocks. Also, copying large amounts of data causes wear that may contribute to early failure of a device.

Some approaches to dealing with both large portions of data and small portions of data in an efficient manner use metablocks of variable size, where the size of the metablock is tailored to the portion of data to be stored. Examples of such approaches are described in U.S. Patent Application Publication Nos. 2005/0144357, 2005/0144363 and 2005/0144367. These approaches use large metablocks for large host files, and small metablocks for small files or small amounts of control data.

Other approaches to dealing with large portions of data and small portions of data in an efficient manner use metablocks of uniform size, but allow updating of fewer than all the erase blocks of a metablock at a time. Where an update occurs to data within a single erase block of a metablock, an update block is created. Updated data and valid data from the original erase block are copied to the update block, then the update block is linked to the metablock, replacing the original erase block. Examples of such relinking are described in U.S. patent application Ser. No. 11/648,487, filed on Dec. 28, 2006.

A memory array may consist of multiple planes, with each plane having its own read/write circuits. A plane generally contains multiple erase blocks. In an embodiment of the present invention, planes of the memory array are grouped into banks, with each bank being capable of independent operation. Banks can be operated together in parallel to program a single metablock with a high degree of parallelism. A single bank can operate to update blocks in that bank which are then relinked to a metablock. In addition, two or more banks may perform such relinking in parallel on erase blocks from different metablocks. Such parallel operation may improve performance by performing multiple operations of individually low parallelism together to achieve relatively high parallelism.

FIG. 1 shows a portion of an exemplary memory system 100 having planes 0-7 grouped in banks (bank 0-bank 3), which are capable of independent operation (i.e. access to bank 0 may occur without access to banks 1-3). Each plane has dedicated read/write circuits 101a-101h for programming data to cells in their respective planes and reading data stored in cells of their respective planes. Read/write circuits of banks 101a-h are connected to bank controllers 103a-103d (flash controllers) by busses 105a-105d (e.g. read/write circuits 101a and 101b are connected to bank controller 103a by bus 105a). Thus, each bank has a dedicated bus and a dedicated bank controller to facilitate independent operation and to provide high performance. Bank controllers for different banks are connected by an input/output bus 107 over which data is sent to and from other portions of the memory system, such as a main memory controller and input/output circuits that link the memory system to a host. In other arrangements, flash controllers may be shared by two or more banks, or only a single main controller may be used. The memory system of FIG. 1 is an exemplary system, though other memory systems may also be used. In particular, a shared bus and a single common controller may be used, though in some cases this will be slower than having dedicated busses and bank controllers.

Figure 2:
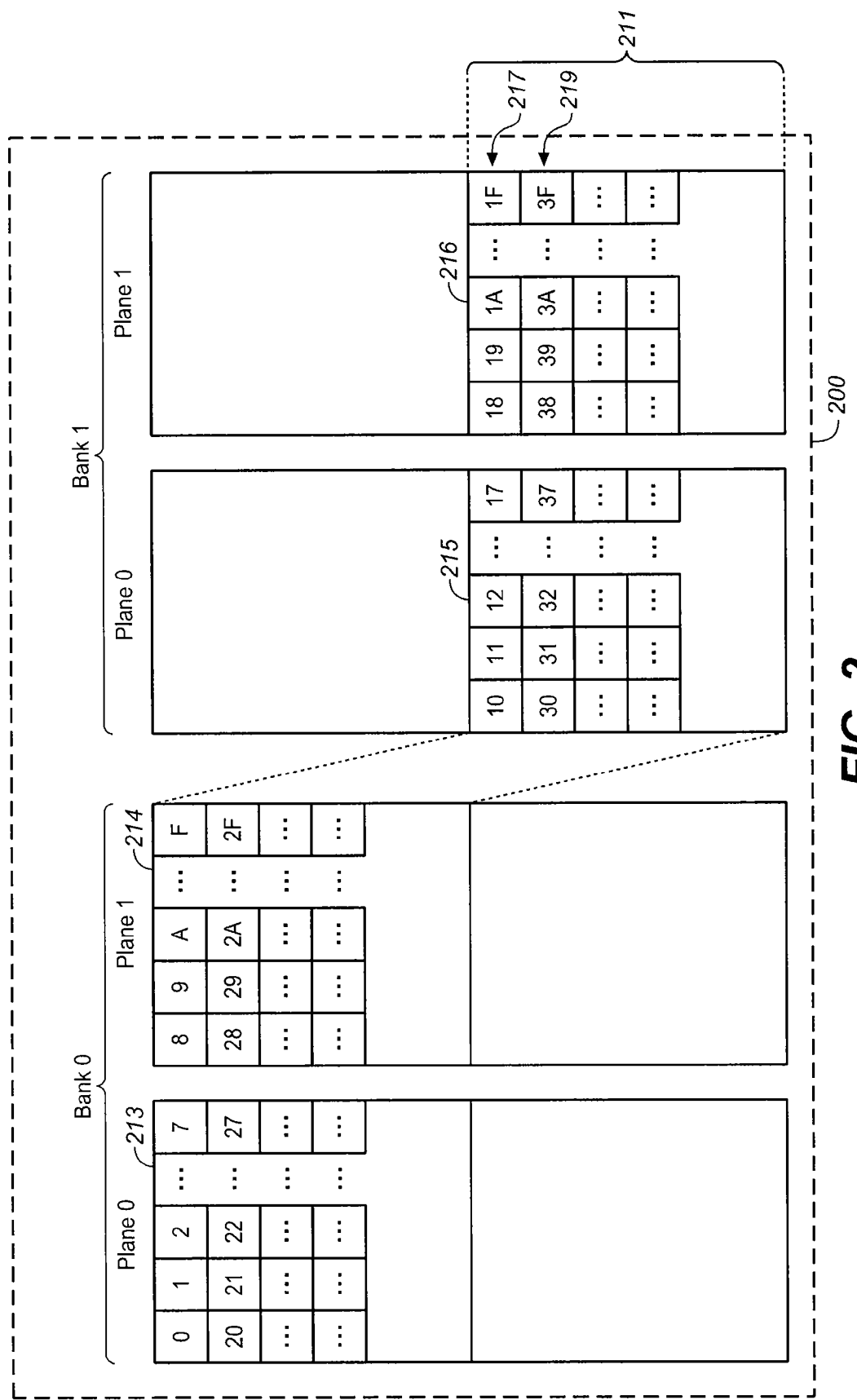
FIG. 2 shows sectors of data stored in a metablock that consists of four erase blocks in two different banks.

FIG. 2 shows how data is stored in a metablock in a portion of a memory array 200. In particular FIG. 2 shows a memory array consisting of two banks, bank 0 and bank 1, with two planes in each bank, and a metablock 211 that extends across both banks. Metablock 211 consists of erase blocks 213-216. When data is stored in a memory array, it is generally in the form of addressable units of data, where each unit of data is assigned a logical address. Typically, the addressable unit of data used is a sector, which consists of 512 bytes of user data, plus some overhead (e.g. an additional 16 bytes including ECC data). FIG. 2 shows units having logical addresses 0-3F (in hexadecimal notation) stored in two metapages 217, 219 of the metablock 211, where a metapage consists of one page from each erase block of the metablock, all pages of the metapage programmed in parallel for high performance. The first metapage 217 is programmed with units having sequential logical addresses 0-1F, then the second metapage 219 is programmed with additional units 20-3F, that are logically sequential to the units of the first metapage 217. The sequential order reflects the order in which a host typically sends large portions of data, and this provides high sequential write performance. In general, greater parallelism increases sequential write performance, although power limitations may impose a maximum degree of parallelism. The number of planes that are programmed together in a particular architecture may be chosen to satisfy a sequential write performance requirement. Also, the number of planes within a bank may be chosen so that a typical write command does not extend across more than one bank. This can facilitate efficient updating of data due to write commands and facilitate separate operation of different banks, as most host updates are written to a single bank, not spread across multiple banks, so that other banks are free to perform other operations while one bank is being updated. In one example, the planes of a particular die are grouped together as a bank. Although data may be stored nonsequentially also, it is generally desirable to store data sequentially so that keeping track of data is simpler. In general, a metablock is assigned to store data of a limited continuous logical address range called a logical group. The amount of data in a logical group is equal to the capacity of a metablock. The data of the logical group is generally spread out across planes of the memory array, so that each plane contains sectors having a discontinuous logical address range.

Where a relatively large portion of data has been updated in an update metablock (e.g. data extending over both banks of FIG. 2), and closure of the update metablock is required (e.g. because of new data from the host), it may be appropriate to update the entire metablock. In this case, the updated data is generally left in place in the update metablock, and valid data from the original metablock is copied to the update metablock. When a relatively small portion of data is updated (e.g. data extending over less than one bank), it may be preferable to only update erase blocks of one bank, leaving the remaining erase blocks of the metablock intact and relinking the new erase blocks with the old erase blocks to form an updated metablock. It should be noted that the determination of whether to update the entire metablock (both banks of FIG. 2) or just erase blocks of a limited number of banks depends not on the number of units of data being updated, but on whether they span more than a threshold number of banks (e.g. more than one bank in FIG. 2) in the original metablock. Thus, updating of units 0-F (16 units) may be done within bank 0 because all units are within bank 0. However, updating of units E-11 (4 units) would generally involve both banks because these logical addresses extend across both banks. While FIG. 2 shows a simple example of a memory array having just two banks, more than two banks may provide greater parallelism and thus improve performance. In one example, 16 banks are provided. The term "sub-metablock" may be used to describe the portion of a metablock that is within an individual bank and that is operated independently in embodiments of the present invention. Thus, the metablock 211 of FIG. 2 is made up of two sub-metablocks, each containing two erase blocks (erase blocks 213 and 214 form one sub-metablock, erase blocks 215 and 216 form another sub-metablock). Thus, in this example, the number of erase blocks in a sub-metablock is equal to the number of planes in a bank. Sub-metablocks are generally independently operated for a limited operation, such as updating a small portion of data, or for garbage collection operations, but are otherwise operated together as part of a metablock. The sub-metablock is the smallest unit of erase used in this example. Even though the memory hardware may allow individual erase blocks to be erased, the memory system treats the sub-metablock as the minimum unit of erase. As shown in FIG. 2, sub-metablocks contain data having discontinuous logical address ranges because of the way data is written to a metablock.

Figure 3A:
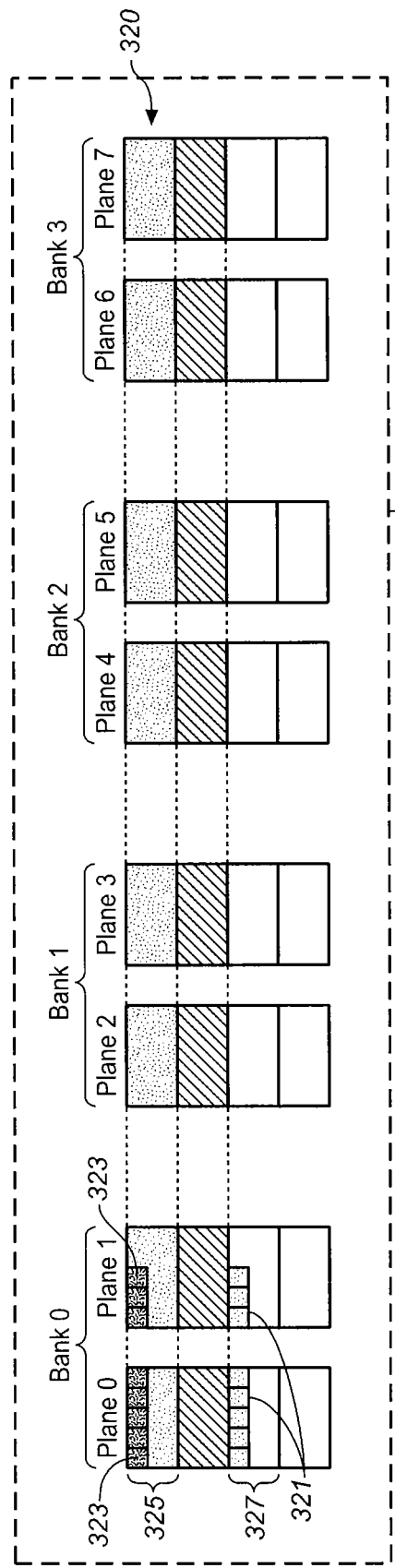
FIG. 3A shows an example where a small portion of updated data is received and stored in bank 0 of a memory array, the portion of data updating data previously stored in the same bank.
Figure 3B:
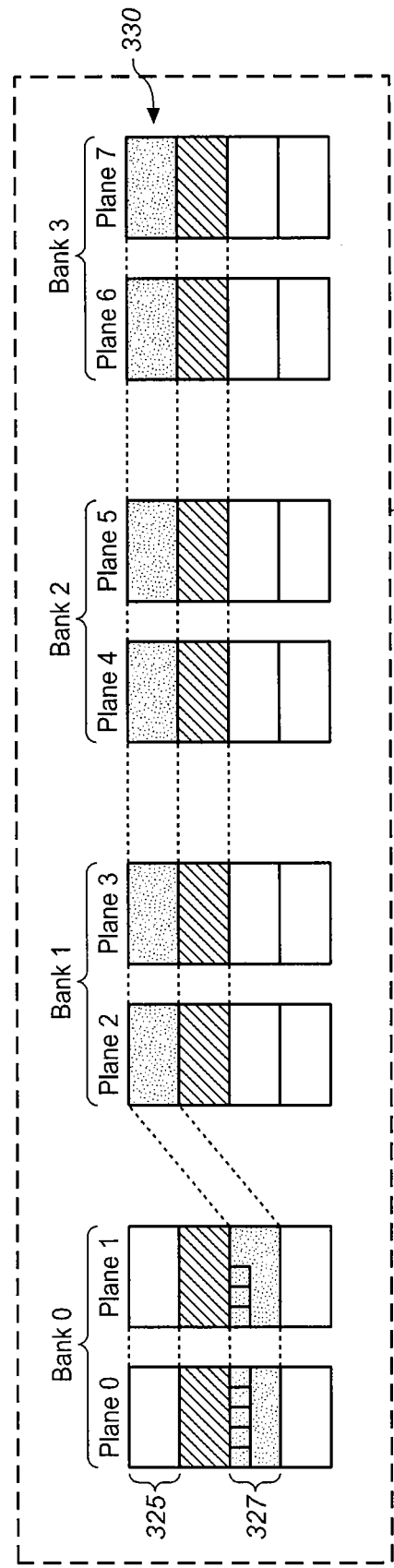
FIG. 3B shows the memory array of FIG. 3A after valid data is copied in bank 0, without copying data in other banks, and the new sub-metablock is linked to the unchanged sub-metablocks to form an updated metablock.

FIG. 3A shows an example of a memory array 300 having four banks, bank 0-bank 3, each consisting of two planes. Metablocks, including metablock 320, extend across banks 0-3. Updated data 321 is received that corresponds to data 323 already stored in a portion of a first sub-metablock 325 of metablock 320 that is in bank 0 (i.e. updated data 321 has logical addresses that are the same as those of units of data 323 in the first sub-metablock 325 in bank 0). The updated data 321 is initially stored in an erased sub-metablock 327 in bank 0 making corresponding data 323 obsolete as indicated by shading. Then, when the original sub-metablock 325 is closed, valid data from the original sub-metablock 325 in bank 0 (data that is not being replaced) is copied to the new sub-metablock 327 as shown in FIG. 3B. The original sub-metablock 325 is erased at this point as shown. The new sub-metablock 327 is relinked to the other sub-metablocks of the original metablock 320 to form an updated metablock 330. Thus, a metablock that spans four banks is updated with a small portion of data without copying data in each bank. In this example, data in only one bank (bank 0) is copied. In other examples, data in more than one bank may be copied while data in other banks remains in place.

While the example of FIGS. 3A-3B avoids copying large amounts of data which would be required if all sub-metablocks were copied, banks in which data is not being copied (banks 1-3), are idle during the copy operation. Additional performance improvement may be obtained by carrying out other operations in these banks while copying is being carried out in bank 0. In particular, other copying operations may be carried out, or a read operation, a host data write operation, garbage collection operation, or any other operation may be carried out in parallel with the copying of data in bank 0. Thus, instead of leaving banks idle during an operation that uses a limited number of banks, other banks may perform other operations in parallel.

FIG. 4A shows an example of a memory array 400 where relatively small portions of data are written to different banks. These could be portions of updated host data, control data or other data. In particular, updated data 431 associated with a sub-metablock 433 of a first metablock 435 in bank 0 is written to a new sub-metablock 437 of bank 0. Updated data 439 associated with sub-metablocks 441, 443 of a second metablock 445 in banks 1 and 2 are written to new sub-metablocks 447, 449 in banks 1 and 2. Obsolete data in sub-metablocks 433, 441, and 443 are indicated by shading. These write operations may occur in parallel or at different times. When a situation such as that of FIG. 4A occurs, it may be necessary (due to lack of update block resources) to perform a copying operation to copy valid data to the new sub-metablocks 437, 447, 449 and free the old sub-metablocks 433, 441, 443 to be erased and reused. In the present example, this copying is performed in parallel for the sub-metablock 433 of the first metablock 435 in bank 0, and for sub-metablocks 441, 443 of the second metablock 445 in banks 1 and 2.

FIG. 4B shows the result after parallel copying of valid data of sub-metablock 433 of the first metablock 435 to the new sub-metablock 437 of bank 0 and copying valid data of sub-metablocks 441, 443 of the second metablock 445 to the new sub-metablocks 447, 449 of banks 1 and 2. It should be noted that even though there is no updated data in plane 5 in sub-metablock 449, data is still copied to sub-metablock 449 in plane 5 because planes 4 and 5 are linked together in a bank. Individual erase blocks 443a, 443b of sub-metablock 443 are treated as a single minimum unit of erase so that data is copied from both erase blocks 443a, 443b before erasing both of them together. No copy operation is performed by bank 3 in this example. However, a read operation, write operation, garbage collection operation, or other operation may be performed in bank 3 to make use of the time during copying of data in banks 0-2. Original sub-metablocks are erased at this point so that they are available for storage of additional data.

Figure 4C:
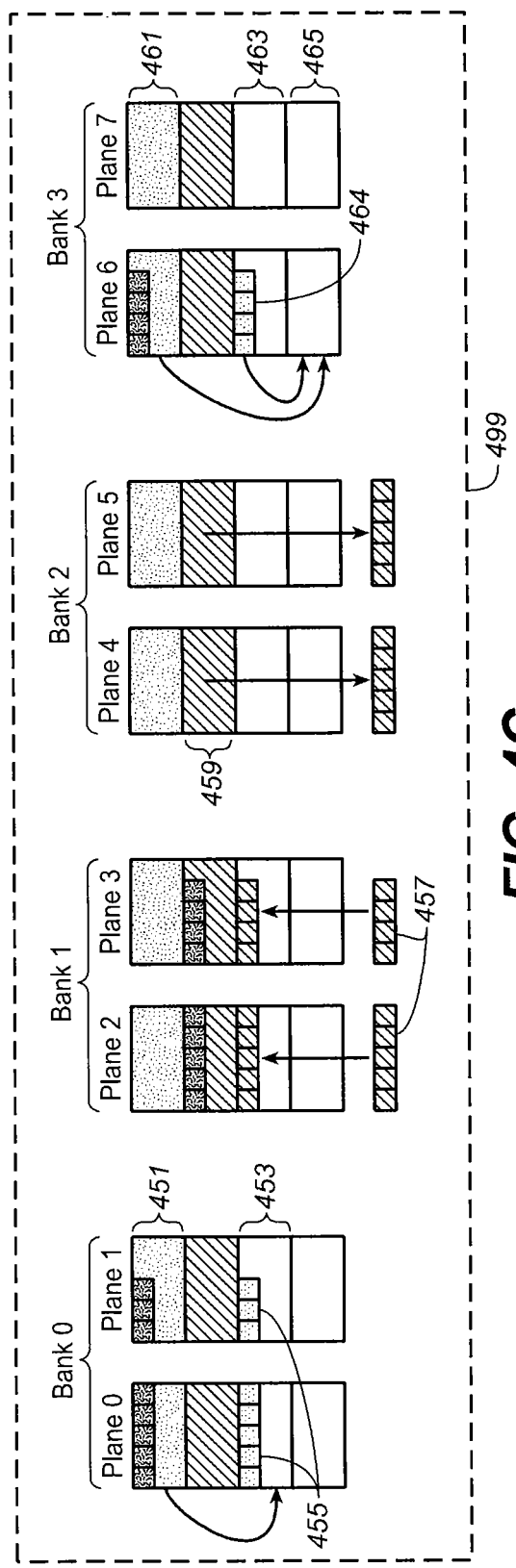
FIG. 4C shows another example where different banks perform different operations in parallel.

FIG. 4C shows another example of a memory array 499 with multiple different operations occurring in parallel in different banks. In particular, in bank 0, valid data is being copied from a first sub-metablock 451 to a sub-metablock 453 containing updated data 455, as previously described with respect to FIG. 4B. In bank 1, new host data 457 is being written. In bank 2, data is being read from a sub-metablock 459. In bank 3, valid data is being copied from an original sub-metablock 461, and from a sub-metablock 463 containing updated data 464, to a new sub-metablock 465. This copying is in contrast to the copying of bank 0, in that a new sub-metablock 465 is used instead of using the sub-metablock 463 that contains the updated data 464. One reason to do this is if the updated data 464 is in a different format to the original data in sub-metablock 461. For example, original data in sub-metablock 461 may be in MLC format and updated data 464 may be in SLC format, in which case it is desirable to rewrite the updated data 464 in MLC, which requires a new sub-metablock.

In SLC format, a cell has one of two memory states and thus stores one bit of data. In MLC format, a cell has more than two memory states and stores more than one bit of data, for example two bits, four bits, or more. By storing more bits per cell, MLC increases memory capacity. However, programming MLC cells generally takes longer. Also, because memory states correspond to threshold voltage ranges of memory cells, more memory states generally means a smaller margin between distribution levels of adjacent states, and therefore a greater sensitivity to disturbance and a higher number of errors when the data is read.

In some memory systems, data is stored in both SLC format and MLC format. SLC and MLC cells may be in physically separate portions of the memory array that are dedicated SLC and MLC portions. In one example, SLC memory may be on one chip and MLC memory may be on another chip in the same memory system. Alternatively, a portion of the memory array may be configured as MLC at one time and SLC at another time according to requirements. Generally, it is faster to write data in SLC, so for performance reasons, it may be preferable to write data initially in SLC format and later copy the data to a location where it is written in MLC format. In some memory systems, all data is initially written in SLC format and later rewritten in MLC format. In other cases, short writes are initially written in SCL format and later rewritten in MLC format, while longer writes are written directly in MLC format. Where certain blocks are maintained for the initial writing of data in SLC format, these blocks may form a binary cache, which contains data that is later rewritten in MLC format. In one example, a few blocks from each plane are maintained as a binary cache to allow rapid writing of updated data. Generally, the blocks making up the binary cache are used for updated data in different metablocks and so they contain sectors of data from different logical groups.

Figure 5A:
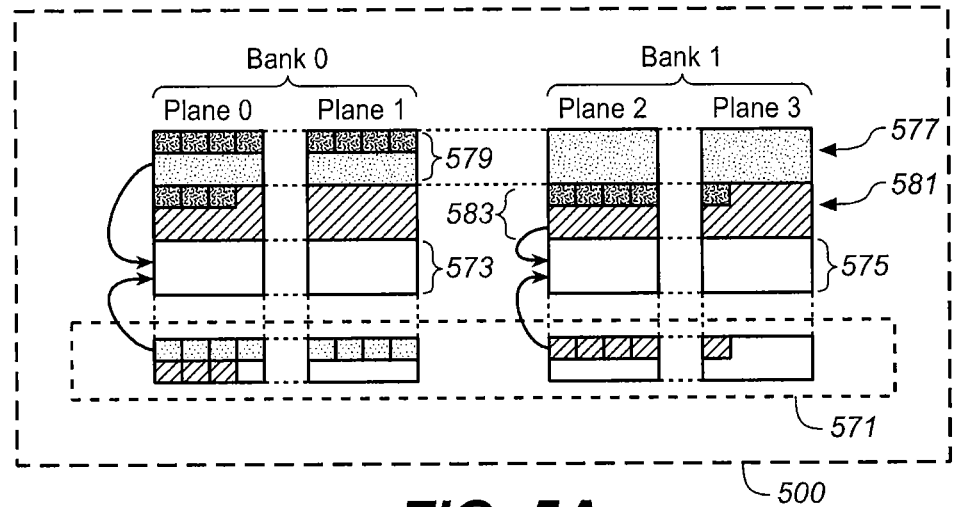
FIG. 5A shows a memory array having some erase blocks operating in SLC mode and other blocks operating in MLC mode, with updated data initially written in SLC mode and later copied, updated data for different metablocks being copied in parallel.
Figure 5B:
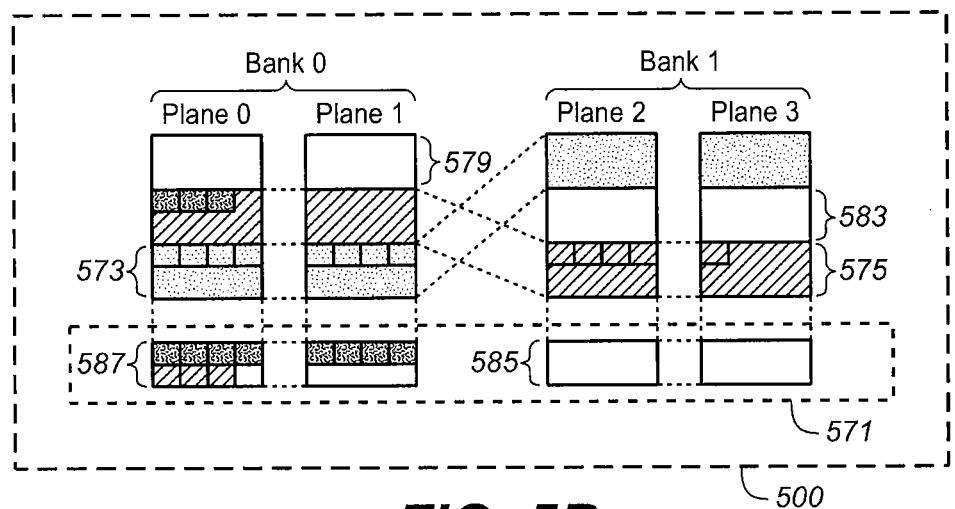
FIG. 5B shows the memory array of FIG. 5A after copying of data initially written in SLC mode to erase blocks that operate in MLC mode, data for two different metablocks copied in parallel.

According to an embodiment of the present invention, data is copied from binary cache to MLC blocks in two or more different banks in parallel, with one bank updating a sub-metablock of a first metablock and another bank updating a sub-metablock of another metablock. FIG. 5A shows a memory array 500 having two banks, bank 0 and bank 1, each having two planes. A binary cache 571 is shown with one sub-metablock in each bank. Portions of updated data are shown stored in the binary cache 571. In the present example, the data in binary cache is copied to new sub-metablocks 573, 575. However, sub-metablocks of different metablocks are updated in each bank. In bank 0, metablock 577 is updated with updated data from binary cache 571 by copying data from the original sub-metablock 579 and also copying updated data from binary cache 571 to sub-metablock 573 (and rewriting it in MLC format). In parallel, in bank 1, metablock 581 is updated with updated data from binary cache 571 by copying data from the original sub-metablock 583 and also copying updated data from binary cache 571 to sub-metablock 575 (and rewriting it in MLC format). FIG. 5B shows the result, after sub-metablocks 579, 583 that contain only obsolete data are erased. In addition, sub-metablock 585 in binary cache 571 may be erased because only obsolete data was left after copying. In contrast, sub-metablock 587 still contains valid data from a sub-metablock that was not copied. In general, binary cache contains data from different logical groups, and a sub-metablock in binary cache is likely to contain updated data corresponding to multiple sub-metablocks in its bank. Thus, in this example, bank 0 copies data of one logical group (the logical group of metablock 577), while in parallel bank 1 copies data of a different logical group (the logical group of metablock 581).

Generally, copying of data to a new block occurs because a host write operation triggers the closing of an open update block and copying of valid data, or because of some house keeping operation that the memory system performs to free space in the memory array. A sub-metablock may be chosen for copying based on the amount of updated data (number of updated sectors) for the sub-metablock in binary cache. Such copying makes the updated data in the binary cache obsolete. Alternatively, a sub-metablock may be chosen for copying because it is the least recently updated sub-metablock within the binary cache of the same bank. In this way, each bank independently chooses which data to update and so update operations are separately optimized for each bank. This tends to avoid copying data that is frequently updated and is likely to become obsolete again soon.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Although the various aspects of the present invention have been described with respect to certain preferred embodiments, it is understood that the invention is entitled to protection within the full scope of the appended claims.

What is claimed is:

1. A method of operating a block-erasable nonvolatile memory array comprising:
   programming first data to a first plurality of blocks in parallel, each of the first plurality of blocks from a different one of a plurality of planes and from a first metablock, the first metablock having a fixed storage capacity;
   programming second data to a second plurality of blocks in parallel, each of the second plurality of blocks from a different one of the plurality of planes and from a second metablock, the second metablock having a fixed storage capacity equal to the fixed storage capacity of the first metablock;
   subsequently performing a first operation comprising copying data from a first block of the first plurality of blocks, without copying data from other ones of the first plurality of blocks, the first block located in a first plane of the plurality of planes; and
   in parallel with performing the first operation comprising copying data from the first block, accessing a second block of the second plurality of blocks, the second block located in a second plane of the plurality of planes, wherein the first plane from which the first block is copied differs from the second plane from which the second block is accessed, and wherein accessing the second block comprises performing a second operation separate and independent from the first operation comprising copying data from the first block.

2. The method of claim 1 wherein the copying of data from the first block is part of garbage collection.

3. The method of claim 1 further comprising, subsequent to copying data from the first block, erasing the first block.

4. The method of claim 1 wherein data copied from the first block is copied to a third block in the first plane and the first metablock, and accessing the second block includes copying data to a fourth block in the second plane and the first metablock.

5. The method of claim 1 wherein accessing the second block includes writing data to the second block.

6. The method of claim 5 wherein data written to the second block is received from a host as part of a host write operation.

7. The method of claim 1 wherein accessing the second block includes reading data from the second block.

8. The method of claim 4 wherein the first plurality of blocks are linked together as a first linking in memory management when the first plurality of blocks are programmed, the second plurality of blocks are linked together as a second linking in memory management when the second plurality of blocks are programmed, and subsequently the first block is replaced by the third block in the first linking in memory management and the second block is replaced by the fourth block in the second linking in memory management.

9. The method of claim 1 wherein the plurality of planes include all planes of the memory array and the first data is programmed with maximum parallelism.

10. The method of claim 1 wherein data is copied from the first block and from at least one additional block to a replacement block, where at least one of the first block and the at least one additional block is a Single Level Cell block and the replacement block is a Multi Level Cell block.

11. The method of claim 10 wherein the additional block is a Single Level Cell block and the additional block contains data from two or more logical groups.

12. The method of claim 11 wherein the first block is selected for copying in response to a determination that the additional block contains more updated data for the first block than for any other block.

13. The method of claim 10 wherein the first block is selected for copying in response to a determination that updated data for the first block is the least recently updated data in the additional block.

14. The method of claim 1 wherein data is copied from the first block and from at least one additional block to a replacement block, where at least one of the first block or the at least one additional block are part of a write cache.

15. The method of claim 1 wherein the first plane is in a first bank of planes that share a first controller and a first bus, and the second plane is in a second bank of planes that share a second controller and a second bus.

16. The method of claim 1 wherein the first data consists of a first logical group and the second data consists of a second logical group.

17. A nonvolatile memory system comprising:
a block erasable nonvolatile memory array having blocks arranged in separate planes, each plane having separate read/write circuits; and
a controller for performing the following operations:
programming a first metablock formed from a first plurality of blocks, one block from each of a plurality of planes, the first plurality of blocks linked for parallel programming, the first metablock having a fixed number of planes;
programming a second metablock formed from a second plurality of blocks, one from each of the plurality of planes, the second plurality of blocks linked for parallel programming, the second metablock having a fixed number of planes equal to the fixed number of planes of the first metablock;
subsequently to programming the first metablock, performing a first operation comprising programming a first replacement block that replaces a first block of the first plurality of blocks, without replacing other blocks of the first plurality of blocks;
subsequently to programming the second metablock, performing a second operation comprising programming a second replacement block that replaces a second block of the second plurality of blocks, without replacing other blocks of the second plurality of blocks; and
replacing the first block with the replacement block in the first operation in parallel with replacing the second block with the second replacement block in the second operation, wherein the second operation is separate and independent from the first operation, and wherein the first block and the first replacement block are in a first plane and the second block and the second replacement block are in a second plane that differs from the first plane, and wherein the first metablock differs from the second metablock.

18. The nonvolatile memory system of claim 17 wherein the first plane is in a first bank comprising a first plurality of planes, that are arranged to perform erase operations in parallel on a block from each of the first plurality of planes of the first bank, and the second plane is in a second bank comprising a second plurality of planes, that are arranged to perform erase operations in parallel on a block from each of the second plurality of planes of the second bank.

19. The nonvolatile memory system of claim 18 wherein the first bank has a first bus and the second bank has a second bus.

20. The nonvolatile memory system of claim 18 wherein first bank has a first controller and the second bank has a second controller.

21. The nonvolatile memory system of claim 17 further comprising a memory management structure for recording a first linking of the first plurality of blocks and a second linking of the second plurality of blocks, the memory management structure further configured for recording the replacement, in the first linking, of the first block by the first replacement block and the replacement, in the second linking, of the second block by the second replacement block.

22. The nonvolatile memory system of claim 17 wherein the plurality of planes are grouped into banks individually comprising planes that are configured to perform erase operations in parallel on a block from each of the planes, a submetablock formed by the blocks from each of the planes being the minimum unit used for a parallel erase operation.

23. The nonvolatile memory system of claim 22 wherein each of the banks has a dedicated bus.

24. The nonvolatile memory system of claim 22 wherein each of the banks has a dedicated controller.

* * * * *